United States Patent
Nagelmüller

(10) Patent No.: US 11,489,453 B2
(45) Date of Patent: Nov. 1, 2022

(54) POWER MODULE WITH DEFINED CHARGE-REVERSAL PATH AND PRODUCTION METHOD

(71) Applicant: Miba Energy Holding GmbH, Laakirchen (AT)

(72) Inventor: Martin Nagelmüller, Edt bei Lambach (AT)

(73) Assignee: Miba Energy Holding GmbH, Laakirchen (AT)

( * ) Notice: Subject to any disclaimer, the term of this patent is extended or adjusted under 35 U.S.C. 154(b) by 15 days.

(21) Appl. No.: 17/058,112

(22) PCT Filed: May 24, 2019

(86) PCT No.: PCT/AT2019/060175
§ 371 (c)(1),
(2) Date: Nov. 23, 2020

(87) PCT Pub. No.: WO2019/222784
PCT Pub. Date: Nov. 28, 2019

(65) Prior Publication Data
US 2021/0203244 A1  Jul. 1, 2021

(30) Foreign Application Priority Data

May 25, 2018  (AT) .............................. A 50428/2018
May 25, 2018  (AT) .............................. A 50429/2018
(Continued)

(51) Int. Cl.
*H05K 7/20* (2006.01)
*H02M 7/00* (2006.01)
*H02G 5/04* (2006.01)

(52) U.S. Cl.
CPC .............. *H02M 7/003* (2013.01); *H02G 5/04* (2013.01); *H05K 7/2089* (2013.01); *H05K 7/20254* (2013.01); *H05K 7/20927* (2013.01)

(58) Field of Classification Search
CPC ..... H02M 7/003; H02G 5/04; H05K 7/20254; H05K 7/2089; H05K 7/20927
(Continued)

(56) References Cited

U.S. PATENT DOCUMENTS 5,914,860 A  *  6/1999  Janko .................... F28F 21/085
                                                  361/710
6,326,761 B1 * 12/2001  Tareilus ................ H02M 7/003
                                                  318/722
(Continued)

FOREIGN PATENT DOCUMENTS

CN        102835013 A    12/2012
DE     102007023980 B3    9/2008
(Continued)

*Primary Examiner* — Anatoly Vortman
(74) *Attorney, Agent, or Firm* — Stoel Rives LLP

(57) ABSTRACT

The invention relates to a method for producing a power module (1) and a power module (1), in particular for a medium or high voltage converter (2), comprising at least one power semiconductor module (3), at least one energy storage module (5), at least one cooling device (7), at least two busbars (10), wherein the cooling device (7) is configured to be electrically conductive and is connected to a protective housing (19) shielding at least the power semiconductor module (3) from the environment, which protective housing (19) has at least one insertion opening (20) for inserting and fastening a connecting element (15), and an electrically conductive connecting element (15) is arranged at a predefinable connection position (16) between at least the cooling device (7) and one of the busbars (10) for forming a defined charge-reversal path (17).

39 Claims, 5 Drawing Sheets

(30) Foreign Application Priority Data

| May 25, 2018 | (AT) | A 50430/2018 |
|---|---|---|
| May 25, 2018 | (AT) | A 50431/2018 |
| Sep. 13, 2018 | (AT) | A 50787/2018 |

(58) Field of Classification Search
 USPC .......................................................... 361/688
 See application file for complete search history.

(56) References Cited

U.S. PATENT DOCUMENTS

| 6,870,738 | B2* | 3/2005 | Goebl | H01L 25/072 |
| | | | | 257/E25.026 |
| 6,956,742 | B2* | 10/2005 | Pfeifer | H02M 7/003 |
| | | | | 257/E23.098 |
| 6,972,957 | B2* | 12/2005 | Beihoff | H05K 7/20927 |
| | | | | 361/689 |
| 8,059,404 | B2* | 11/2011 | Miller | H02M 7/003 |
| | | | | 174/547 |
| 9,007,767 | B2 | 4/2015 | Nakajima | |
| 9,115,707 | B2* | 8/2015 | Hattori | H02K 11/33 |
| 9,350,228 | B2* | 5/2016 | Uetake | H02M 1/44 |
| 10,003,274 | B2* | 6/2018 | Takahashi | H05K 9/002 |
| 10,849,252 | B2* | 11/2020 | Sun | H05K 5/061 |
| 2007/0165376 | A1* | 7/2007 | Bones | H01L 25/162 |
| | | | | 257/E25.031 |
| 2008/0130223 | A1* | 6/2008 | Nakamura | H02M 7/003 |
| | | | | 361/689 |
| 2010/0265744 | A1* | 10/2010 | Dorn | H05K 7/1432 |
| | | | | 257/712 |
| 2010/0321896 | A1 | 12/2010 | Yamada | |
| 2013/0279114 | A1* | 10/2013 | Nishikimi | H02M 7/003 |
| | | | | 361/699 |
| 2014/0204533 | A1* | 7/2014 | Abeyasekera | H01L 23/34 |
| | | | | 361/699 |
| 2014/0334105 | A1* | 11/2014 | Chen | H05K 7/209 |
| | | | | 361/728 |
| 2015/0296653 | A1* | 10/2015 | Mathieu | H05K 7/20909 |
| | | | | 361/690 |
| 2016/0081202 | A1* | 3/2016 | Hetzel | H05K 7/20672 |
| | | | | 361/724 |
| 2016/0181940 | A1* | 6/2016 | Takahashi | H05K 7/1432 |
| | | | | 361/752 |

FOREIGN PATENT DOCUMENTS

| DE | 102009053998 A1 | 5/2011 |
| EP | 1995840 A1 | 11/2008 |
| EP | 2043412 A1 | 4/2009 |
| JP | H11299262 A | 10/1999 |
| WO | 2006056555 A2 | 6/2006 |

\* cited by examiner

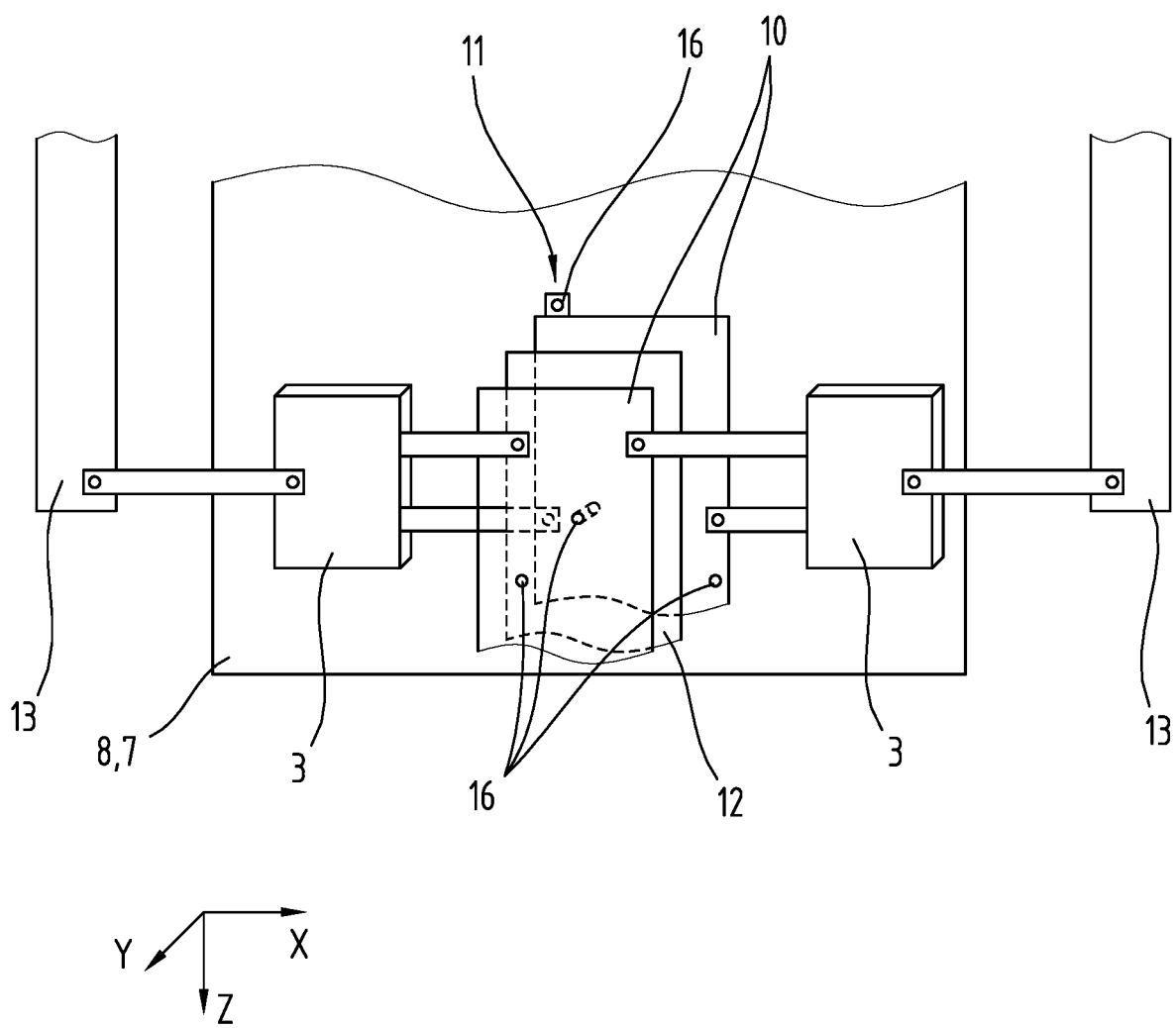

POWER MODULE WITH DEFINED CHARGE-REVERSAL PATH AND PRODUCTION METHOD

RELATED APPLICATIONS

This application is a national stage under 35 U.S.C. § 371 of International Application No. PCT/AT2019/060175, filed May 24, 2019, which claims priority of Austrian Patent Application Nos. A50428/2018, A50429/2018, A50430/2018, and A50431/2018, all filed May 25, 2018, and Austrian Patent Application No. A50786/2018, filed Sep. 13, 2018.

TECHNICAL FIELD

The field of the present disclosure relates to a method and a power module for a medium or high voltage converter, in particular a modular multilevel converter, wherein, at least between the cooling device and a busbar, a connecting element for forming a defined charge-reversal path is arranged.

BACKGROUND

By applying power electronic converters alternating current is converted into direct current and/or vice versa. In this process, inverters (or modular multilevel converters, MMC) are often used. Such modular multilevel converters usually consist of a plurality of series-connected power modules, which can also be referred to as submodules. Each power module can be actuated independently of the other power modules. The arrangement of the power modules often takes place in a frame and/or rack, wherein a low construction volume as well as minimizing the cost and ensuring the insulation requirements are to be taken into account by the person skilled in the art. In this regard, the person skilled in the art knows a plurality of possible arrangements of energy storage modules, power semiconductor modules, associated control devices and in particular cooling devices provided for cooling these elements.

The conductor bars used for contacting the power modules are often configured as copper or aluminum conductors having a plate- or rod-shaped geometry for a low-loss conduction the high currents. The abruptly changing electric potential of current-carrying conductor bars can cause charge-reversal processes of electrical charge between the conductor bars and other, especially flat, components of the power module, which is referred to as parasitic capacitances. These parasitic capacitances can be formed e.g., toward a housing and/or a cooling device or also between other components and cause electromagnetic interference emissions, which impairs the electromagnetic compatibility (EMC).

The power modules subjected to voltage usually have a plurality of electronic parts which require testing of their proper functioning and intactness of their insulation prior to initial operation. This can be done by separate testing of the individual components, such as the individual power semiconductors, before assembling the power module. However, this involves the danger that, during the assembly, individual parts are damaged or that electrically conductive small parts inadvertently remain in the power module, which, during operation, could lead to an undefined current discharge path or to an undesired partial discharge. This can, in the worst case, lead to a short circuit. Testing and/or examining the entire power module in the final state at the end of the mechanic completion is usually also only possible with a great degree of manual effort. This constitutes a considerable disadvantage for the cost-effective production and quality assurance.

US 2016/181940 A1 discloses a current converting device comprising a metal housing, a power semiconductor module, a capacitator module, a circuit carrier and a base plate. In this regard, a noise shielding element is provided, which is electrically connected to the metal housing or a ground of the control circuit part.

SUMMARY

The present disclosure provides a device and a method, by means of which a simple, safe and cost-effective formation of a defined current discharge path can be carried out. Embodiments according to the present disclosure may keep away unavoidable parasitic discharge currents and/or leakage currents from undesired points of the power module and therefore to reduce EMC problems as well as defects and/or current-induced material degradation. Moreover, embodiments according to the disclosure may provide a simple method for avoiding the aforementioned problems and for examining a power module, as well as the increase of safety and quality and furthermore, the reduction of production and/or examination costs.

The power module according to disclosed embodiments for a medium or high voltage converter, in particular a modular multilevel converter, comprises at least one power semiconductor module, at least one energy storage module, at least one cooling device and at least two conductor bars. The cooling device is configured to be electrically conductive and connected to a protective housing shielding at least the power semiconductor module from the environment, which protective housing has at least one insertion opening for inserting and fastening a connecting element. An electrically conductive connecting element is arranged at a predefinable connection position for forming a defined charge-reversal path between at least the cooling device and one of the busbars. Such a charge-reversal path can also be understood as a defined current return path and/or discharge path.

For contacting the power module, in particular the power semiconductor and/or the power semiconductor module, conductor bars are provided. Electrical connections of the conductor bars can serve for contacting and conducting the current into the power module and/or to power modules adjacently connected in series and project out of the protective housing.

Each power semiconductor module comprises at least one power semiconductor module such as an IGBT or comparable electronic parts. Each energy storage module comprises at least one energy storage preferably configured as a capacitor.

At least one power semiconductor module can be coupled, with two busbars that are electrically insulated from each other, to the at least one energy storage module. The busbars provided for applying different electrical potentials are arranged so as to be electrically separated from one another, preferably via an insulation layer. In this regard, the busbars may be configured as a part of a connection terminal for electrically connecting the at least one energy storage module to at least one power module. The busbars can be arranged so as to be electrically separate from the cooling device via insulators. The exact embodiment of the electrical components, e.g., the busbars, insulators, energy storage module and/or power semiconductor module, can be optimized by the person skilled in the art in accordance with the requirements of the power module.

According to the disclosed embodiments, the cooling device is brought to a similar or substantially the same electrical potential as contacted busbar by the electrical connecting element, whereby the influence of parasitic capacitances can be reduced to a defined amount. By forming the electrically conductive cooling device, a very good thermal conductivity and therefore heat dissipation is achieved by the at least one power semiconductor module, preferably arranged so as to be thermally contacting. Therefore, by forming a defined charge-reversal path between the, preferably metal, cooling device and a busbar, unavoidable parasitic discharge currents can be kept away from undesired locations. This allows to achieve an improved EMC emission. Likewise, the formation of defects and/or material degradation due to the influence of parasitic capacitances on sensitive components of the power module can be reduced or even avoided in this manner.

The power module formed according to disclosed embodiments and/or the corresponding method can, in some circumstances, also be used for applications in the low voltage range and/or can be optimized for such applications with the aid of minor measures.

Analogously to the above-mentioned embodiment of the power module according to the present disclosure, at least one such power module is provided as a method step. Further method steps comprise:

fastening and/or arranging a protective housing, closing off at least the power semiconductor module toward the environment, on the cooling device, which protective housing has at least one insertion opening for inserting and fastening a connecting element, and forming a defined charge-reversal path by affixing the connecting element on the predefinable connection position between at least the cooling device and one of the busbars through the insertion opening.

The power module configured according to the disclosed embodiments, in particular the protective housing connected to the cooling device, an effective protection from external influences such as dust, fluids etc. can be achieved for the at least one power semiconductor module. Conversely, the protective housing can also serve outwardly as a shield from flying parts, for example in case of an explosive destruction of a power semiconductor module and be formed so as to be substantially closed for this purpose. The protective housing comprises at least one insertion opening through which the connecting element can be securely inserted and fastened. A great advantage of this is that the connecting element is introduced into the power module as the last electrically effective element. Thus, contamination or damage to the power module can be avoided efficiently.

This is of particular advantage seeing as possible electrical examinations of the insulation and/or for partial discharge routes of individual components or also of the entire power module can be carried out prior to mounting the connecting element. Such examinations are known to the person skilled in the art inter alia from the norms EN 50178, EN 60060-1 or also IEC 62501, which are cited by way of example.

Furthermore, it can be useful if the connecting element is formed to be releasable, preferably as a screw element, plug element or locking element.

This possible embodiment allows a simple and safe installation, allows the temporary removal of the connecting element during maintenance work or for examination purposes. For concluding such work, the connecting element can again be placed as the last electrically effective element. Additionally, a screwed, plugged or locked connecting element can ensure a good connectivity of the connecting element to the potential of the busbar. Furthermore, the connecting element is well-protected from corrosion.

Moreover, it can be provided that the connecting element has a cross-section which is formed to be more than 10%, preferably more than 20% larger than a minimum cross-section required for forming the defined charge-reversal path and diverting parasitic discharge currents.

Depending on the type and size of the power module, parasitic discharge currents of different degrees, which should be taken into account by the person skilled in the art for forming the charge-reversal path for the design of the electrically conductive minimum cross-section of the connecting element. However, it can be of considerable advantage to increase the electrically conductive cross-section of the connecting element by 10% and more, relative to the mentioned minimum cross-section, as a thermally effective connection to the cooling device can be formed in this manner, in addition to the formation of a defined charge-reversal path. Hence, an additional heat dissipation at least of the contacted busbar toward the cooling device can be carried out in a simple manner. In addition, a support element of the connecting element abutting on the busbar, such as a screw head, can favor a good heat dissipation into the connecting element, whereby the heat dissipation can be improved.

Furthermore, it can be provided that at least two power semiconductor modules are arranged on at least two sides of the busbar with an orientation normal to a plane of the busbar, preferably opposite.

The busbars are configured as "flat", meaning substantially two-dimensionally extended, electrical conductors and thus specify a reference plane in two spatial directions, wherein sides of the busbar are thus directed toward the third spatial direction. The arrangement of multiple, meaning at least two, power semiconductors on two sides of the busbars or also surrounding the busbars can be used for homogenizing the power and/or current distribution substantially into the third spatial direction. Such an arrangement can reduce the length of the current paths and thus the undefined formation of parasitic leakage currents and thus improve the EMC. Likewise, the formation of parasitic inductances due to symmetry effects can be reduced in this manner.

Moreover, it can be provided that the connecting element is arranged so as to electrically connect at least one of the busbars to the cooling device and to go through at least one other busbar and to electrically insulate from it.

This measure allows the person skilled in the art a great number of possible connection positions, which allows an optimal arrangement of the respective electrical components such as the power semiconductor modules, energy storage modules, auxiliary modules etc., without obstructing the potential connection of the cooling device to a busbar in doing so. The electrical insulation to the non-contacted busbar can be ensured by an air gap or also suitable insulating materials such as a plastic sleeve. This can lead to an additional increase of the mechanical stability.

An embodiment according to which it can be provided that the connecting element is arranged in the center of the plane of the busbars.

In doing so, a particularly efficient arrangement of the at least one, preferably multiple, power semiconductor module/s around the busbars can take place. Moreover, this measure favors the symmetry of the arranged electrical components and allows the formation of current paths of approximately the same length, whereby the influence of parasitic capacitances can be reduced, and the EMC can be improved. Analogously, this applies for parasitic inductances.

According to a further development, it is possible that at least one of the busbars has a laterally protruding connection lug for contacting the connecting element.

Such a projection of a busbar is cost-effective and simple to realize and additionally allows a particularly simple installation without having to provide additional insulation elements to the non-contacted busbar.

Furthermore, it can be useful if an insertion element, preferably having a channel or pipe shape, is formed so as to extend at least partially from the insertion opening of the protective housing in the direction of the nearest busbar.

Such an insertion element can significantly facilitate the insertion of the connecting element. As this process is to be carried out when the protective housing is closed, this measure further serves the protection against loss of the connecting element and can reduce the required installation time and make the complicated insertion or installation tools obsolete.

Furthermore, it can be provided that the insertion opening is closed by means of a closing element, preferably a stopper or a screw. This closing process should take place during or after mounting the connecting element.

In doing so, the protective housing can be efficiently closed off to the environment from inflow and exit of fluids, dust and/or foreign bodies. Such a closing element can, for the purpose of the present disclosure, be understood as the last electrically non-effective element in the production and/or maintenance process of the power module. This can considerably increase the safety of operation as well as maintenance.

Moreover, it can be provided that the protective housing is configured to be electrically conductive and to be electrically connected to the cooling device.

The electrically conductive protective housing can thus be brought to the electrical potential of the cooling device and the busbar in a simple manner. In such an electrically conductive protective housing, the influence of parasitic capacitances and undesired discharge currents due to the electrical connection of the protective housing to the electrically conductive cooling device can be controlled very well and/or even avoided. Such a protective housing can also be laminated, coated and/or varnished and still be brought to the substantially same electrical potential by the electrical contacting to the cooling device, whereby inevitable parasitic discharge currents can be adjusted and/or directed.

According to a particular embodiment, it is possible that the protective housing is electrically connected to the cooling device and one of the busbars.

This direct connection of the protective housing to one of the busbars and the electrically conductive cooling device can be accomplished relatively easily by means of the electrical connecting element. In this case, the predefinable connection position is formed at three points along the connecting element. This way, the defined charge-reversal path between at least the cooling device and one of the busbars can be selected with a very short length. Moreover, it is easily conceivable that this measure at the end of the production and/or examination procedure of the power module is particularly advantageous.

It can further be provided that, during or after mounting the connecting element, the insertion opening is closed by means of a closing element, preferably a stopper or a screw.

By affixing a "closure" for the protective housing, dirt, fluids etc. can be effectively prevented from entering the inside, and the operational safety can thus be increased. In addition, the explosion protection can be increased by closing the protective housing. The insertion opening can, for accommodating the closing element, have a suitable shape such as a thread or the like. In the method according to the present disclosure, the separate closing element therefore constitutes the last electrically non-effective part in the production and/or maintenance work of the power module, whereby damage to the electrical components, e.g., during assembly, can be avoided very well. Depending on the requirements, the closing element can also be configured as, e.g., a partially insulating screw, whereby the electrical connection between at least the cooling device and one of the busbars can be ensured, however, the shaft and/or head of the screw is formed to be insulating with respect to the protective housing. In this case, the electrical connecting element and the closing element are formed in a single part.

Furthermore, it can be provided that, by mounting the connecting element, the insertion opening is closed, and the connection position between at least the cooling device and one of the busbars and the protective housing is formed.

By this measure, a stable connection position can be established at three points by mounting the connecting element, whereby an additional charge-reversal path running from the busbar to the protective housing is formed. Closing and simultaneously electrically connecting the cooling device, a busbar and the protective housing can increase the homogeneity regarding the charge-reversal currents, which, in turn, causes an improved EMC. Moreover, this measure can be carried out as a concluding method step, and a relatively fast and loss-secure mounting of the connecting element can be ensured.

An embodiment according to which it can be provided that, before fastening the protective housing, a first electrical examination of the power module is performed by applying a first examination voltage to at least one predefinable insulation route, is also advantageous.

In the context of the present disclosure, an insulation route can be understood to be an electrical path which, after completion of the power module, is to be at a common, intended electrical potential. Analogously, such an insulation route can thus comprise one or also multiple electrical components and/or modules or parts. Such a first electrical examination of insulation routes can be used for checking a base insulation, wherein possible short circuits and/or loose parts can be detected in a very simple manner. The advantage of this measure is that such an examination can be performed relatively easily and in particular in an automated manner, before the power module is completed and the electrical connecting element is mounted. Such an examination is preferably performed in a range of low voltage, for instance 5 to 10 V.

Furthermore, it can be useful if, after the first examination and/or after the fastening of the protective housing, a second electrical examination of the power module is performed by applying a second examination voltage that is increased relative to the first examination voltage to at least one predefinable insulation route.

Such a second examination can be used for checking the electrical connections and insulation routes for load capacity and is sensibly performed only after the first examination, in order to avoid damage to the power module. This serves for checking the functional insulation and is therefore preferably performed in a range of 100 V to approximately 400 V.

This examination is advantageously performed before mounting the electrical connecting element.

In addition, it can be provided that, at least between one of the busbars and the cooling device and/or the protective housing, a control examination regarding the proper functioning and/or the presence of the electrical connecting element is performed.

This measure can be taken as a type of final examination for examining the proper functioning of the electrical connecting element. In doing so, the quality of the power module can be ensured relatively easily, and the safety of future operation can be warranted. This control examination is preferably performed automatically.

According to an advantageous further embodiment, it can be provided that the cooling device is designed as a load-bearing cooling plate which can be flown through by a coolant.

In this embodiment, the cooling device is configured as a load-bearing constructional element in form of a cooling plate, wherein a great advantage is that a support function of the power module can be exerted on the rack, and the cooling plate simultaneously forms a receiving platform for all of the modules arranged on the cooling device and/or cooling plate. The cooling plate thus serves as a kind of mounting platform to accommodate the energy modules, power semiconductor modules and potential other components. Such components can for example be arranged on the cooling plate in the form of an auxiliary module and can for example comprise a controller, power supplies, resistors and the like. Depending on the structure and type of the medium or high voltage converter, in this regard, it can be advantageous to arrange at least one power semiconductor module on one side, e.g., the upper side, of the cooling plate and to arrange the at least one energy storage module on the opposite side, e.g., on the bottom side, of the cooling plate. Analogously to this, "standing" cooling plates are also conceivable. Furthermore, this configuration can contribute to ensuring the local heat dissipation of the electrical components, in particular of the power semiconductor module, in a very efficient manner and simultaneously allow a space-saving arrangement of multiple power modules in the rack of the medium or high voltage converter. The receiving spaces and/or support surfaces, on which the cooling plate is supported, are electrically insulated from one another to avoid short circuits between individual power modules.

In particular, it can be useful if the energy storage module is arranged on a side of the cooling plate opposite the at least one power semiconductor module and the at least two busbars, wherein the cooling plate has a passage for connecting the energy storage module to the at least one power semiconductor module.

This way, the cooling plate can create an effect as an explosion protection between the electrical components which are arranged on the respective sides. In addition, the passage, preferably arranged centrally in at least one direction, allows a relatively simple electrical connection of the power semiconductor module to the energy storage module, preferably via a connection terminal which comprises the busbars. This allows very short electrical connection routes between the current-carrying components, on the one hand, and subsequently, a reduction and/or homogenization of parasitic capacitances and/or inductances. This measure can thus considerably contribute to an improvement of the EMC.

BRIEF DESCRIPTION OF THE DRAWINGS

For the purpose of better understanding of the invention, it will be elucidated in more detail by means of the figures below.

These show in a respectively very simplified schematic representation:

FIG. 2 a schematic oblique view of a possible arrangement of electrical components on the cooling device with different possible connection positions of the connecting element;

DETAILED DESCRIPTION OF PREFERRED EMBODIMENTS

First of all, it is to be noted that in the different embodiments described, equal parts are provided with equal reference numbers and/or equal component designations, where the disclosures contained in the entire description may be analogously transferred to equal parts with equal reference numbers and/or equal component designations. Moreover, the specifications of location, such as at the top, at the bottom, at the side, chosen in the description refer to the directly described and depicted figure and in case of a change of position, these specifications of location are to be analogously transferred to the new position.

Figure 1:
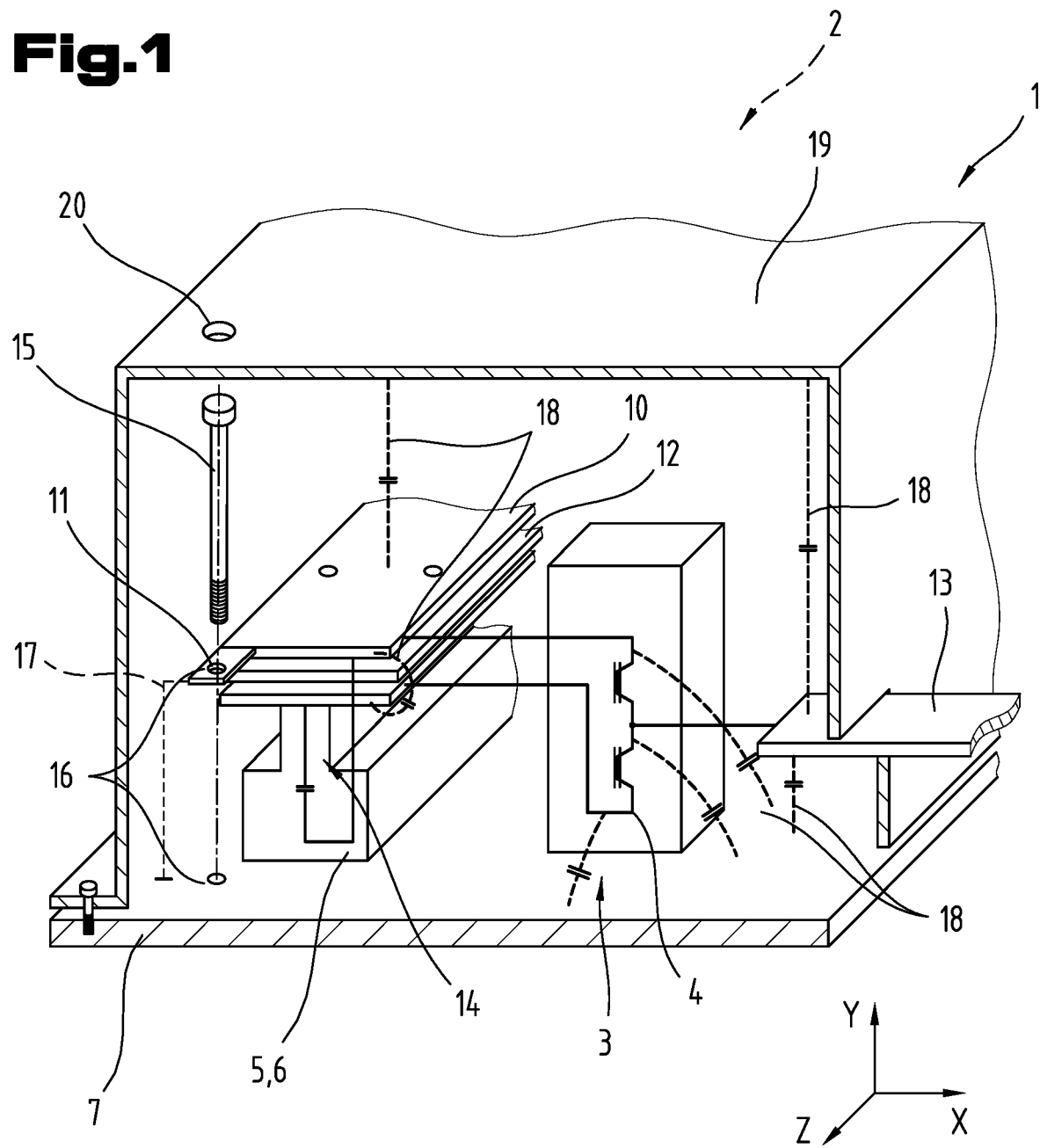
FIG. 1 a schematic representation of a power module with electrical components and a connecting element.

FIG. 1 shows a schematic representation of a power module 1 according to a presently preferred embodiment for a medium or high voltage converter 2 that is not specially represented. The power module 1 comprises at least one power semiconductor module 3 as well as at least one energy storage module 5 as well as at least one cooling device 7. The power semiconductor module 3 can be connected to the energy storage module 5 for example via busbars 10 and/or a connection terminal 14. Such arrangements are known in detail to the person skilled in the art and are only depicted schematically here. The current supply and/or contacting with external power connections is and/or schematically with the aid of a conductor bar 13. The busbars 10 that usually have a flat configuration are separated from one another by an insulation layer 12. The potential of the conductor bars 13 alternating at a high frequency can lead to an unwanted storing of electrical charge between the conductor bars 13 and other, particularly flat, components of the power module 1. This is referred to, among other designations, as parasitic capacitance 18 and is adumbrated by the corresponding symbols and dashed connection lines between possible electrical components of the power module 1, on which such parasitic capacitances 18 can occur.

The schematic representation in FIG. 1 makes it possible to comprehend the functional principle of the power module 1 configured according to the preferred embodiment, in which a cooling device 7 is configured to be electrically conductive and on which the at least one power semiconductor module 3 is arranged preferably in a directly heat transferring manner. The power semiconductor module 3 comprises at least one power semiconductor module 4 such as an IGBT or similar suitable electronic parts. A protective housing 19 is connected to the cooling device 7 for protection against the environment. According to the preferred embodiment, a defined charge-reversal path 17 and/or current path is formed between at least the cooling device 7 and one of the busbars 10 by means of a connecting element 15, for improving the electromagnetic compatibility. The charge-reversal path 17, shown in dashed lines, is formed at a suitable connection position 16 by means of a connecting element 15. The mounting of the connecting element 15 takes place as the last electrically effective element of the power module 1. This is made possible by an insertion opening 20 in the protective housing 19. This way, a defined current and/or charge-reversal path 17 can be created for unavoidable parasitic discharge currents, and the influence of parasitic capacitances 18 at undesired locations can be mostly reduced or even avoided, whereby the EMC as well as defects and/or material degradation of individual components can be reduced.

The principle of forming a defined charge-reversal path 17 by mounting the connecting element 15 at a predefinable connection position 16 as seen in FIG. 1, can be applied to FIGS. 2 to 4 and is further explained in the following with the aid of some possible exemplary embodiments.

The connecting element 15, which is shown as a screw by way of example in FIG. 1, can, as in FIG. 2 in combination with FIG. 3, be arranged so as to electrically connect one of the busbars 10 to the cooling device 7, wherein at least one of the busbars 10 is contacted. In FIG. 2, two power semiconductor modules 3 are arranged, by way of example, on opposing sides of the busbars 10. Such an arrangement makes short electrical conduction paths possible and thereby improves the electromagnetic compatibility by decreasing parasitic inductances. In FIG. 2, it can further be seen that the connection position 16 between the cooling device 7 and/or the cooling plate 8 to at least one of the busbars is possible at different positions. The connection position 16 can, for example, be configured on a connection lug 11 protruding laterally on one of the busbars 10 for contacting the connecting element 15 to the cooling plate 8.

With reference to the preceding discussion of FIGS. 1 and 2, further exemplary embodiments of power modules 1 are shown in FIGS. 3a to 3d. The busbars 10 can be shielded from one another and/or supported by an insulation layer 12 and/or toward the cooling device by insulators 9.

Figure 3A:
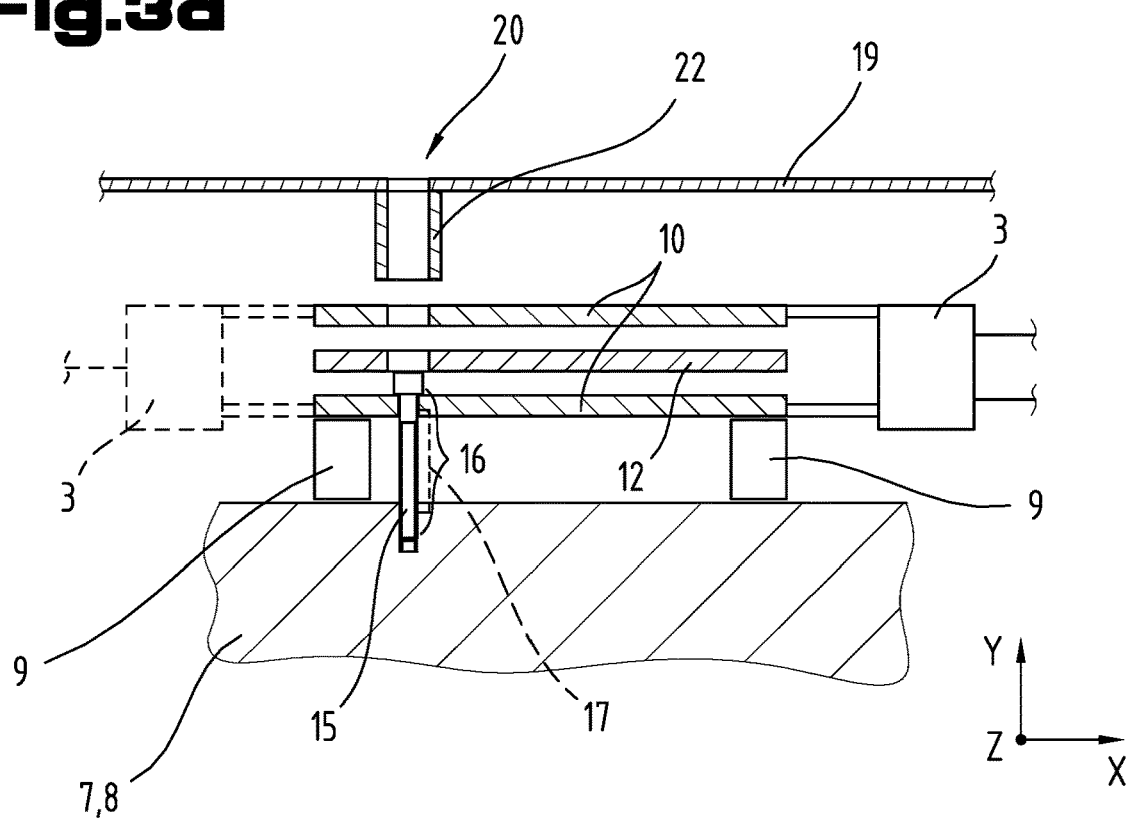
FIG. 3 different possible embodiments of the power module with connection positions, going through the busbars (a) and/or arranged centrally (b) or on a connection lug (c)

FIG. 3a represents a schematic cross-sectional view, in which the lower busbar 10 in the vertical direction is connected to the conductive cooling device and/or cooling plate 8 by the connecting element 15. In the representation of FIG. 3a, it can further be seen that an insertion element 22 is formed on the insertion opening 20 of the protective housing 19 in the direction of the cooling device. This insertion element 22 preferably formed as a pipe or a channel makes the loss-secure insertion and mounting of the connecting element 15 possible.

Figure 3B:
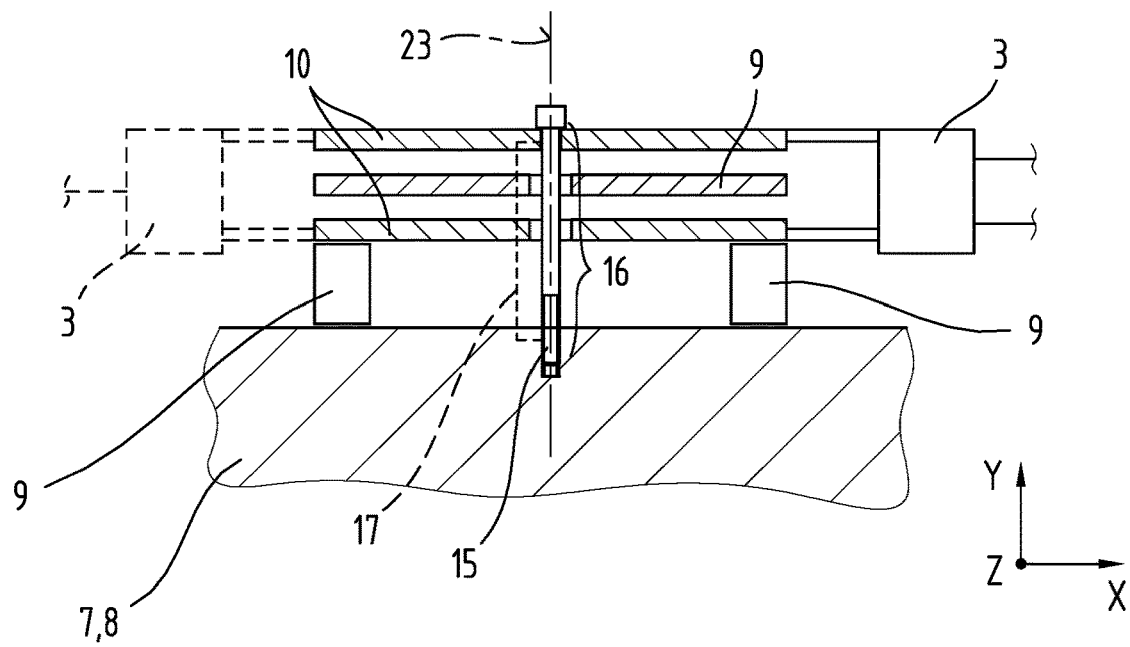

In FIG. 3b, a preferred possible embodiment of a connection position 16 is adumbrated, wherein the connection position is arranged at the center 23 in a plane of the busbars 10. In this case, the uppermost busbar 10 in the vertical direction is connected to the cooling device 7 and/or cooling plate 8 via the connecting element 15.

Figure 3C:
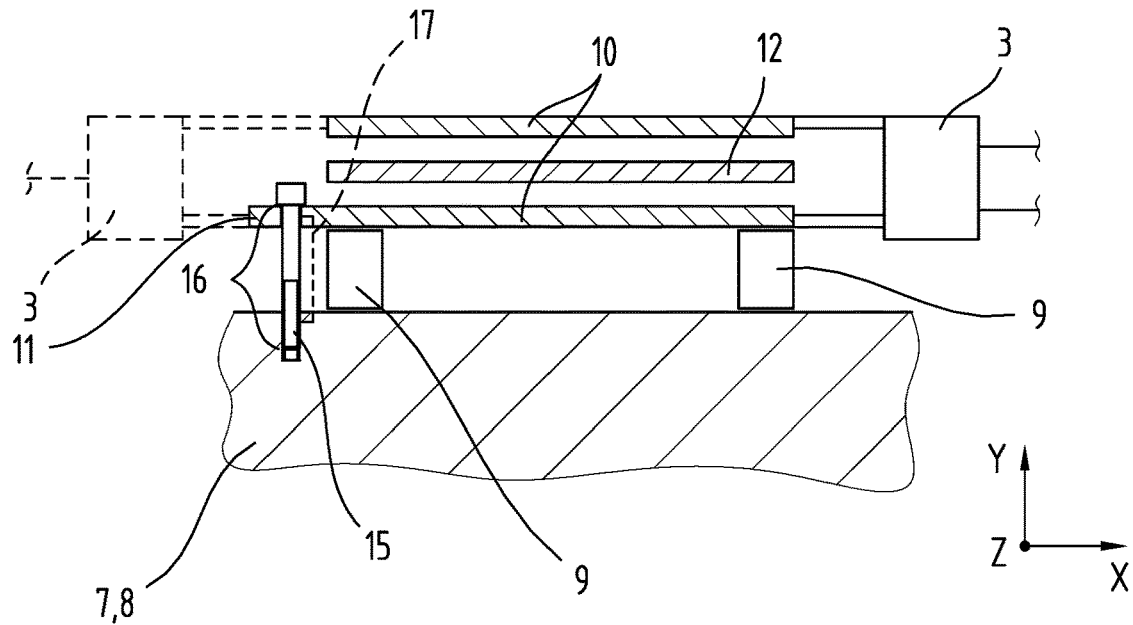

A further possible arrangement of the connecting element 15 can be seen from the sectional view in FIG. 3c, wherein the connection position 16 is formed between a busbar 10 and the cooling device 7 by means of a connection lug 11 protruding laterally on the busbar.

Figure 3D:
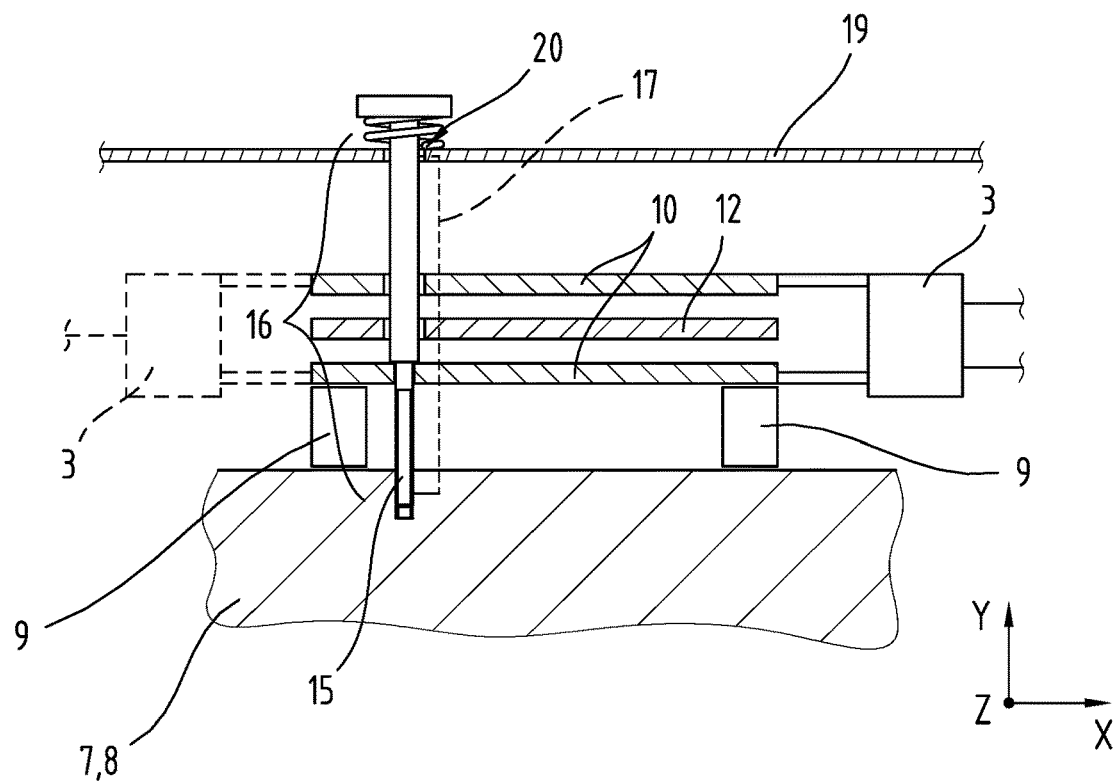

In FIG. 3d, a further and possibly independent embodiment of the power module 1 is shown. In the exemplary depiction of 3d, the protective housing is configured to be electrically conductive and is electrically connected to the cooling device 7 and one of the busbars. The predefinable connection position 16 comprises, in this case, three points along the connecting element 15, on which electrical contacts are formed. In the situation shown, mounting the connecting element 15 simultaneously closes the insertion opening 20 of the protective housing 19. A situation, in which the electrical connecting element 15 is configured as a partially insulating screw, wherein an insulation with respect to the protective housing is formed in the region of the shaft and/or head, is not depicted. In both cases, however, the connecting element 15 and a closing element 21 provided for closing the insertion opening 20 are configured to be a single part.

The connecting elements 15 can have an electrically conductive cross-section which simultaneously contributes to a targeted heat dissipation to the cooling device. In particular, it can be advantageous if the effective cross-section is formed to be at least 10% larger than the required minimum cross-section for the electrical connection and formation of the defined charge-reversal path 17. Moreover, in the case of, e.g., screw-type connecting elements 15, as it can be seen in FIGS. 3a-3c, for example, a broadened screw head can be used for an improved support and/or contacting of the busbar 10, whereby an increased heat absorption and/or heat dissipation can be favored.

Figure 4:
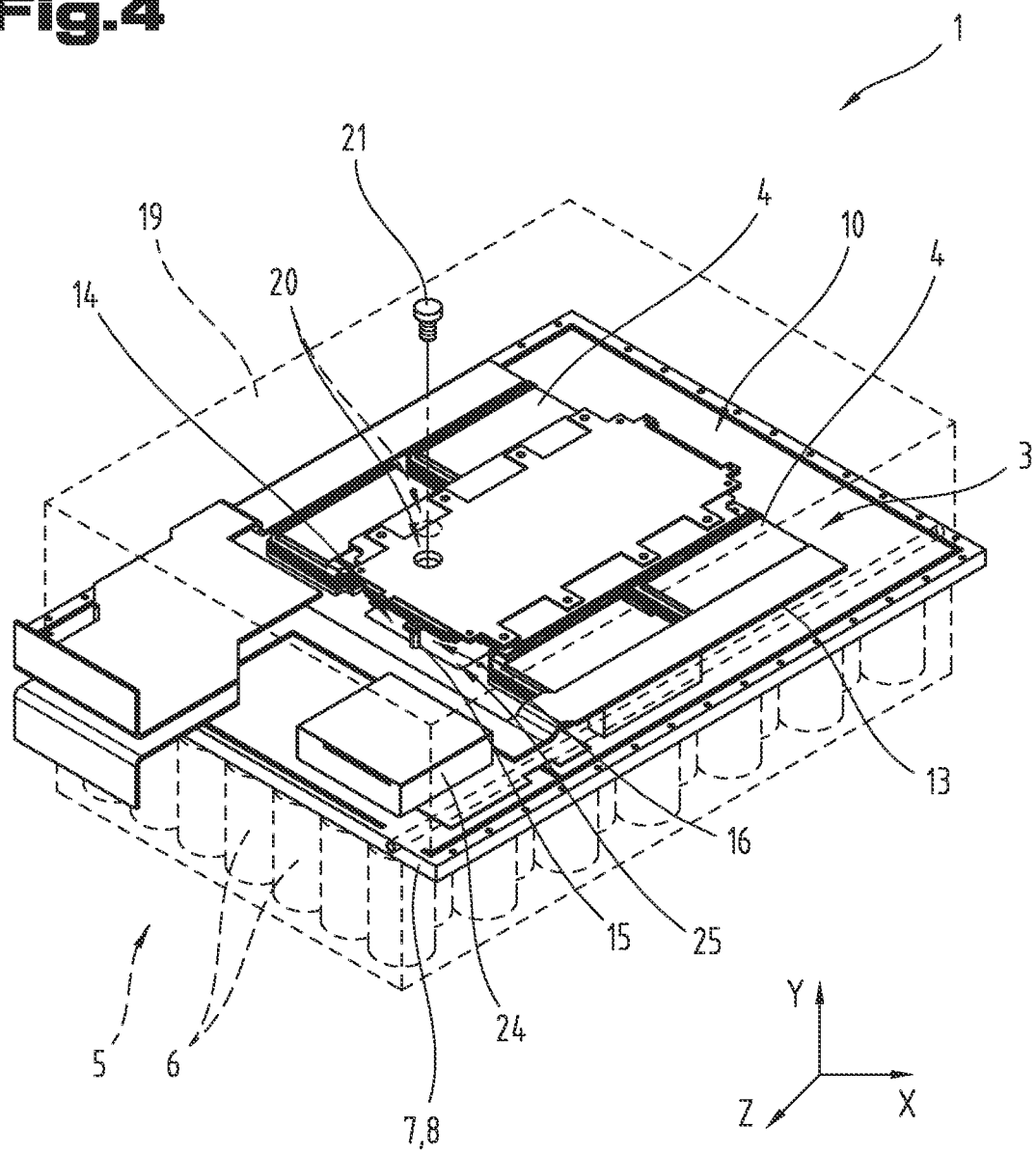
FIG. 4 a schematic oblique view of a possible embodiment of a power module with energy and power semiconductor modules arranged on both sides of the cooling device.

FIG. 4 shows a schematic oblique view of a power module 1. The selected view shows that the at least one power semiconductor module 3 as well as the at least one energy storage module 5 are arranged on opposing sides of the cooling plate 8. A connection of the energy storage module 5 to the power semiconductor module 3 and/or an auxiliary module 24 is possible due to the formation of passage 25 going through the cooling plate 8. In the region of said passage 25, preferably a connection terminal 14 for connecting the electrical components can be located. Such a situation is particularly advantageous in combination with an arrangement of the components of the power module 1 that is symmetrical in the transverse direction and/or longitudinal direction, as it is schematically adumbrated in FIG. 2. Through one or multiple passages 25, the electrical connection paths can be selected with a relatively short length.

Furthermore, FIG. 4 shows that for closing the insertion opening 20 of the protective housing 19, a separate closing element 21 can be provided. Such a closing element 21 is provided as an electrically non-effective element and serves for closing the protective housing 19 to the environment.

The person skilled in the art can easily gather from the drawings of FIGS. 1 to 4 that possible electrical examinations can be performed easily on various, predefinable insulation routes, before and/or after the protective housing 19 has been fastened.

Moreover, FIG. 4 shows that a symmetrical arrangement of the electrical components makes the formation of current paths of approximately the same length possible. This favors the reduction of the influence of parasitic capacitances and/or inductances and improves the EMC. This is a special advantage in the case of flat busbars 10 and/or conductor bars 13, which would be prone to forming parasitic capacitances 18 with respect to a protective housing 19 and/or the electrically conductive cooling plate 8.

The exemplary embodiments show possible embodiment variants, and it should be noted in this respect that the invention is not restricted to these particular illustrated embodiment variants of it, but that rather also various combinations of the individual embodiment variants are possible and that this possibility of variation owing to the teaching for technical action provided by the present invention lies within the ability of the person skilled in the art in this technical field.

The scope of protection is determined by the claims. However, the description and the drawings are to be adduced for construing the claims. Individual features or feature combinations from the different exemplary embodiments shown and described may represent independent inventive solutions. The object underlying the independent inventive solutions may be gathered from the description.

All indications regarding ranges of values in the present description are to be understood such that these also comprise random and all partial ranges from it, for example, the indication 1 to 10 is to be understood such that it comprises all partial ranges based on the lower limit 1 and the upper limit 10, i.e. all partial ranges start with a lower limit of 1 or larger and end with an upper limit of 10 or less, for example 1 through 1.7, or 3.2 through 8.1, or 5.5 through 10.

Finally, as a matter of form, it should be noted that for ease of understanding of the structure, elements are partially not depicted to scale and/or are enlarged and/or are reduced in size.

The invention claimed is:

1. A power module for a medium or high voltage converter, comprising:
    at least two power semiconductor modules,
    at least one energy storage module,
    at least one cooling device that is electrically conductive, and
    at least two busbars, wherein:
        the power semiconductor modules are arranged on at least two sides of at least one of the busbars with an orientation normal to a plane of said at least one busbar,
        the cooling device is connected to a protective housing shielding at least one of the power semiconductor modules,
        the protective housing has at least one insertion opening for inserting and fastening an electrically conductive connecting element when the protective housing is closed, and
        the electrically conductive connecting element is arranged between at least the cooling device and one of the busbars to form a defined charge-reversal path.

2. The power module according to claim 1, wherein the connecting element is releasable.

3. The power module according to claim 1, wherein the connecting element has a cross-section that is more than 10% larger than necessary for diverting parasitic discharge currents.

4. The power module according to claim 1, wherein the connecting element electrically connects at least one of the busbars to the cooling device and extends through at least one other busbar and is electrically insulated from the other busbar.

5. The power module according to claim 4, wherein the connecting element is centered on one of the sides of the busbar to which it is connected.

6. The power module according to claim 1, wherein at least one of the busbars has a laterally protruding connection lug, and the connecting element is connected to the connection lug.

7. The power module according to claim 1, wherein at least a portion of an insertion element extends from the insertion opening of the protective housing in the direction of the nearest busbar.

8. The power module according to claim 1, wherein the insertion opening is closed by a closing element.

9. The power module according to claim 1, wherein the protective housing is electrically conductive and is electrically connected to the cooling device.

10. The power module according to claim 9, wherein the connecting element is arranged such that protective housing is electrically connected to the cooling device and one of the busbars.

11. The power module according to claim 1, wherein the cooling device is a load-bearing cooling plate that can be flown through by coolant.

12. The power module according to claim 11, wherein the energy storage module is arranged on a side of the cooling plate opposite the at least one power semiconductor module and the at least two busbars, wherein the cooling plate has a passage through which the energy storage module is connected to the at least one of the power semiconductor modules.

13. A method for producing the power module of claim 1, comprising the steps of:
    providing the power module according to claim 1,
    fastening the protective housing so as to close off at least one of the power semiconductor modules, and
    forming the defined charge-reversal path by affixing the connecting element between at least the cooling device and one of the busbars through the insertion opening when the protective housing is closed.

14. The method according to claim 13, further comprising:
    during or after mounting the connecting element, closing the insertion opening by means of a closing element.

15. The method according to claim 14, wherein, by mounting the connecting element, the insertion opening is closed and an electrical connection is formed between at least the cooling device, one of the busbars, and the protective housing.

16. The method according to claim 13, further comprising:
    before fastening the protective housing, performing a first electrical examination of the power module by applying a first examination voltage to at least one insulation route of the power module.

17. The method according to claim 16, further comprising:
    after the first examination and/or after the fastening of the protective housing, performing a second electrical examination of the power module by applying a second examination voltage to said at least one insulation route, wherein the second examination voltage is increased relative to the first examination voltage.

18. The method according to claim 13, further comprising:
    between one of the busbars and the cooling device and/or the protective housing, performing a control examination regarding the proper functioning and/or the presence of the connecting element.

19. A power module for a medium or high voltage converter, comprising:
    at least one power semiconductor module,
    at least one energy storage module,
    at least one cooling device that is electrically conductive, and
    at least two busbars, wherein:
        the cooling device is connected to a protective housing that shields the power semiconductor module, the protective housing has at least one insertion opening for inserting and fastening an electrically conductive connecting element when the protective housing is closed, and the electrically conductive connecting element electrically connects at least one of the busbars to the cooling device to form a defined charge-reversal path, and the connecting element extends through at least one other busbar and is electrically insulated from the other busbar.

20. The power module according to claim 19, wherein the connecting element is releasable.

21. The power module according to claim 19, wherein the connecting element has a cross-section that is more than 10% larger than necessary for diverting parasitic discharge currents.

22. The power module according to claim 19, wherein the connecting element is centered on one of the sides of the busbar to which it is connected.

23. The power module according to claim 19, wherein at least one of the busbars has a laterally protruding connection lug, and the connecting element is connected to the connection lug.

24. The power module according to claim 19, wherein the protective housing is electrically conductive and is electrically connected to the cooling device.

25. The power module according to claim 24, wherein the connecting element is arranged such that protective housing is electrically connected to the cooling device and one of the busbars.

26. The power module according to claim 19, wherein the cooling device is a load-bearing cooling plate, the energy storage module is arranged on a side of the cooling plate opposite the at least one power semiconductor module and the at least two busbars, and the cooling plate has a passage through which the energy storage module is connected to the at least one power semiconductor module.

27. A method for producing the power module of claim 19, comprising the steps of:
providing the power module according to claim 19,
fastening the protective housing so as to close off at least one of the power semiconductor modules, and
forming the defined charge-reversal path by affixing the connecting element between at least the cooling device and one of the busbars through the insertion opening when the protective housing is closed.

28. The method according to claim 27, wherein, during or after affixing the connecting element, closing the insertion opening.

29. The method according to claim 27, wherein, by mounting the connecting element, the insertion opening is closed and an electrical connection is formed between at least the cooling device, one of the busbars, and the protective housing.

30. A method for producing the power module of claim 27, further comprising:
before fastening the protective housing, performing a first electrical examination of the power module by applying a first examination voltage to at least one insulation route of the power module.

31. The method according to claim 30, further comprising:
after the first examination and/or after the fastening of the protective housing, performing a second electrical examination of the power module by applying a second examination voltage to said at least one insulation route, wherein the second examination voltage is increased relative to the first examination voltage.

32. The method according to claim 27, further comprising:
between one of the busbars and the cooling device and/or the protective housing, performing a control examination regarding the proper functioning and/or the presence of the connecting element.

33. A power module for a medium or high voltage converter, comprising:
at least one power semiconductor module,
at least one energy storage module,
at least one cooling device that is electrically conductive, and
at least two busbars, at least one of which includes a laterally protruding connection lug, wherein:
the cooling device is connected to a protective housing that shields the power semiconductor module,
the protective housing has at least one insertion opening for inserting and fastening an electrically conductive connecting element when the protective housing is closed, and
the electrically conductive connecting element is arranged between at least the cooling device and the connection lug of one of the busbars to form a defined charge-reversal path.

34. A power module for a medium or high voltage converter, comprising:
at least one power semiconductor module,
at least one energy storage module,
at least one cooling device that is electrically conductive,
at least two busbars,
an electrically conductive protective housing that shields the power semiconductor module, and
an electrically conductive connecting element arranged between the cooling device and one of the busbars to form a defined charge-reversal path, and the connecting element extending through an insertion opening in the protective housing and electrically connecting the protective housing to the cooling device and said one of the busbars.

35. The power module according to claim 34, wherein the connecting element is releasable.

36. The power module according to claim 34, wherein the connecting element has a cross-section that is more than 10% larger than necessary for diverting parasitic discharge currents.

37. The power module according to claim 34, wherein the connecting element is centered on one of the sides of the busbar to which it is connected.

38. The power module according to claim 34, wherein at least one of the busbars has a laterally protruding connection lug, and the connecting element is connected to the connection lug.

39. The power module according to claim 34, wherein the cooling device is a load-bearing cooling plate, the energy storage module is arranged on a side of the cooling plate opposite the at least one power semiconductor module and the at least two busbars, and the cooling plate has a passage through which the energy storage module is connected to the at least one power semiconductor module.

* * * * *